United States Patent [19]

Huetson

[11] Patent Number: 4,902,237

[45] Date of Patent: Feb. 20, 1990

[54] ADAPTOR FOR SURFACE MOUNT AND THROUGH-HOLE COMPONENTS

[75] Inventor: Curtis L. Huetson, Denver, Colo.

[73] Assignees: American Telephone and Telegraph Company, New York, N.Y.; AT&T Information Systems Inc., Morristown, N.J.

[21] Appl. No.: 331,214

[22] Filed: Mar. 30, 1989

[51] Int. Cl.⁴ .......................... H01R 9/09; H05K 3/34
[52] U.S. Cl. ........................................ 439/83; 29/843; 361/405
[58] Field of Search .................... 439/55, 68, 69, 70, 439/71, 72, 73, 78, 83; 361/400–405; 29/837, 839, 840, 843, 845

[56] References Cited

U.S. PATENT DOCUMENTS 3,335,327  8/1967  Damon et al. .................... 439/69
4,645,943  2/1987  Smith, Jr. et al. .................... 307/64

Primary Examiner—Neil Abrams
Attorney, Agent, or Firm—David R. Padnes

[57] ABSTRACT

An adaptor for interfacing a surface mount or through-hole electrical component to a printed circuit board. In one orientation of the adaptor relative to the printed circuit board, the adaptor receives a through-hole component and interfaces this component to a printed circuit board position designed for a surface mount component. In another orientation of the adaptor relative to the printed circuit board, the adaptor receives a surface mount component and interfaces this component to a printed circuit board position designed for a through-hole component. Advantageously, the adaptor is compatible with high-volume assembly techniques, such as wave soldering and machine insertion.

8 Claims, 1 Drawing Sheet

THROUGH-HOLE TO SURFACE MOUNT APPLICATION

SURFACE MOUNT TO THROUGH-HOLE APPLICATION

ADAPTOR FOR SURFACE MOUNT AND THROUGH-HOLE COMPONENTS

TECHNICAL FIELD

The present invention relates to an adaptor for electrical components to be mounted on a printed circuit board and, more particularly, to an adaptor which allows a through-hole component to be mounted in an area on the printed circuit board designed for a surface mount component and vice versa.

BACKGROUND OF THE INVENTION

Assembly of electrical circuits is often accomplished by mounting a myriad of components on a printed circuit board which is patterned to provide the desired electrical connections between components. Such printed circuit boards, which may be rigid or flexible and are fabricated from a variety of materials, may have the electrical interconnections patterned on one or two sides or may have the interconnections formed on a plurality of planar surfaces which are laminated together to form the printed circuit board.

Accordingly, for purposes of this application, the term printed circuit board is intended to encompass any surface which is patterned to provide electrical interconnections between components. Along with the desired interconnections, the printed circuit board also includes a conductive "footprint" or pattern for receiving each electrical component. A printed circuit board may be designed to receive a variety of circuit component types. Each type differs from the other in the structure used for interconnection to the printed circuit board. In one type of component commonly referred to as a through-hole or feed-through component, connection to the printed circuit board is accomplished by feeding wire leads through holes which extend completely through the printed circuit board. Hence, the term "through-hole" is used as a descriptor for these components. In another type of component, known as surface mount, the body of the component is formed with areas of solder or some other meltable and electrically conductive material. Connection between each of these components and the printed circuit board is achieved by melting this conductive material when it is in contact with appropriately-sized conductive areas on the printed circuit board. Such melting is typically provided by reflowing a solder paste or melting the conductive material and generally adding additional conductive material with a solder wave. In lieu of melting, some surface mount components are produced with a conductive adhesive and, therefore, do not require melting for connection to the printed circuit board.

While through-hole and surface mount technologies are well established, problems do arise in manufacturing when one of the component types required for an assembled printed circuit board is temporarily unavailable. Moreover, the required component value is oftentimes available in the other component type and could be used but for the difference in physical structure used for interconnection. This component shortage can, at times, lead to a shut-down of a particular product line, and redesign of the printed circuit board to accommodate mounting of the available component type is both time-consuming and expensive. Redesign of the printed circuit board, of course, is often not an option for cost reasons, especially when only a small number of the printed circuit boards are to be assembled. Therefore, the result is a shut-down of the product line. Accordingly, it would be extremely desirable if the problems associated with component shortages could be resolved.

SUMMARY OF THE INVENTION

Broadly speaking, the present invention overcomes the problems of the prior art related to surface mount or through-hole components by providing an adaptor for mounting either of these component types to a printed circuit board. In accordance with the present invention, the adaptor is bidirectional, i.e., its function changes with orientation with respect to a printed circuit board. Specifically, when the adaptor is oriented in a first position relative to a printed circuit board, it receives a surface mount component and interfaces this component to a printed circuit board position designed for a through-hole component. However, when oriented in a second position relative to a printed circuit board, the adaptor receives a through-hole component and interfaces this component to a printed circuit board position designed for a surface mount component. Advantageously, the adaptor is designed to be suitable for mass production assembly techniques, such as wave soldering. In addition, the adaptor can be fabricated as part of a continuous tape reel to permit machine placement or insertion.

DETAILED DESCRIPTION

Figure 1:
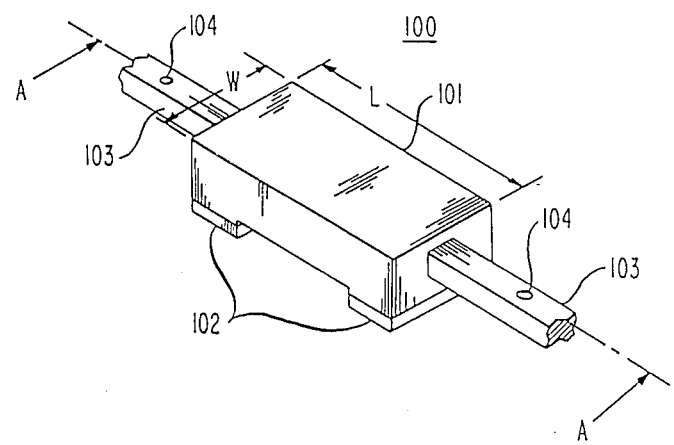
FIG. 1 is a perspective view of an adaptor in accordance with the present invention.

Adaptor 10, shown in FIG. 1, includes a nonconductive block 101 from which conductive pads 102 extend. Each of these pads is electrically connected to a different one of leads 103 via metalization internal to block 101. Each lead 103 may be fabricated with a hole 104 to facilitate attachment of a through-hole component.

Block 101 may be molded out of a plastic material. By judicious sizing of the length L and width W, a few different sizes of block 101 can be used to interface a much larger number of through-hole and surface-mount component sizes. The protrusion of pads 102 from body 101 advantageously elevates most of body 101 off of the printed circuit board when the adapter is mounted on the same by a sufficient distance to permit cleaning to remove flux and other foreign or conductive material which may become entrapped under body 101. Removal of foreign material is typically required to meet circuit pack cleanliness requirements, and conductive material can interfere with circuit pack operation if not removed.

Figure 2:
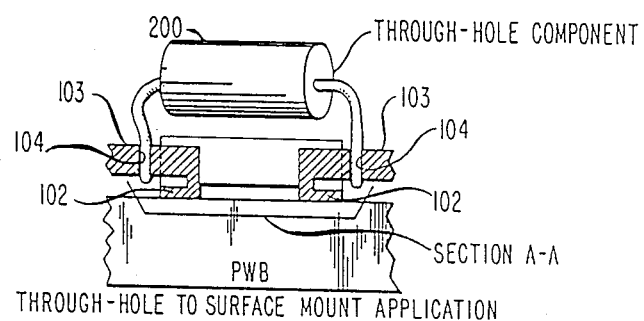
FIG. 2 is a sectional view taken along section line A—A of the adaptor of FIG. 1 which has been arranged to interface a through-hole component to a printed circuit board.

FIG. 2 shows the use of adaptor 100 for interfacing a through-hole component to a printed wiring board (PWB) position designed for a surface mount component. Each lead of through-hole component 200 is connected to an associated one of leads 103. Leads 103 are each elevated off of the printed wiring board to preclude contact therebetween. Also, as shown, each lead of component 200 is inserted into a hole 104 and conductively joined to a respective lead 103. The other side of adaptor 100 is mounted on printed wiring board leads via the joining of conductive pads 102 to associated areas on the printed wiring board. By appropriate spacing of pads 102, adaptor 100 can fit in an area on the printed wiring board designed for a surface mount component and allow the substitution of an equivalent-valued through-hole component for the surface mount component.

The use of appropriately-sized holes provides a fixture for maintaining the position of the through-hole component until it is conductively joined to leads 103. In lieu of such holes, each lead of component 200 could be intertwined with one of leads 103.

Figure 3:
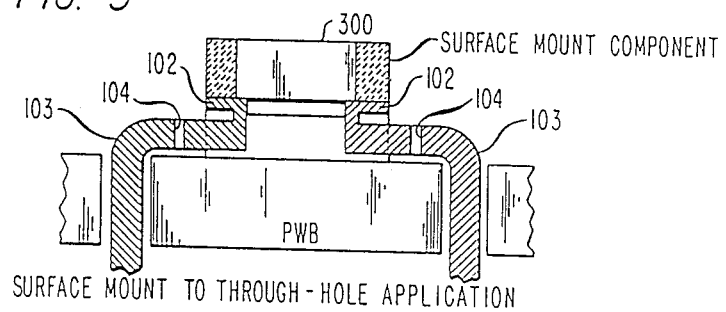
FIG. 3 is a sectional view taken along section line A—A of the adaptor of FIG. 1 which has been inverted so as to interface a surface mount component to a printed circuit board.

FIG. 3 shows the use of adaptor 100 for interfacing a surface mount component to a printed wiring board position designed for a through-hole component. Such use is provided by inverting adaptor 100 relative to its orientation shown in FIG. 2. In addition, the leads 103 are bent at approximately 90° and are inserted into holes on the printed wiring board, and the pads 102 each accept one end of a surface mount component 300. It will be noted that holes 104 are advantageously positioned so as to be offset from the location of the 90° wire bend. Location of the holes at or close to the 90° bend makes the leads more prone to breakage when bent for insertion into the printed wiring board holes.

It should, of course, be understood that while the present invention has been disclosed with reference to a single embodiment, other arrangements will be apparent to those skilled in the art.

For example, while the disclosed adaptor has been described in reference to interfacing components each having two terminals, the adaptor can be extended in the width dimension, W, of FIG. 1 and provided with a plurality of spaced-apart conductive pads 102 and leads 103 in this dimension. As a result, the adaptor can be used for interfacing a SOIC (*S*mall *O*utline *I*ntegrated *C*ircuit) to a printed circuit board position designed for a DIP (*D*ual *I*n-line *P*ackage) and vice versa. SOICs and DIPs are variants of surface mount and through-hole component types, respectively, and differ in the number of conductive pads and wire leads required for interconnection.

We claim:

1. An electrical component adaptor comprising
   first means adapted to receive a surface mount component when said component adaptor is oriented in a first position relative to a printed circuit board, said first means also adapted to electrically interconnect said adaptor to said printed circuit board when said adaptor is oriented in a second position relative to said printed circuit board,
   second means adapted to receive a through-hole component when said adaptor is oriented in said second position relative to said printed circuit board, said second means also being adapted to electrically interconnect said adaptor to said printed circuit board when said adaptor is oriented in said first position relative to said printed circuit board, and
   means for electrically interconnecting said first and second means.

2. The electrical component adaptor of claim 1 wherein said adaptor in said first position is inverted relative to said adaptor in said second position.

3. An electrical component adaptor comprising
   a body member,
   a plurality of substantially planar surfaces formed on a first region of said body member,
   a conductive coating disposed on each of said planar surfaces, each coating being electrically isolated from the other,
   a plurality of wires extending from a second region of said body member, and
   a conductive material interconnecting the coating on each planar surface with a respective one of said wires, said adaptor capable of interfacing a surface mount component to a position on a printed circuit boad adapted to receive a through-hole component when said body member is oriented in a first position relative to said printed circuit board and said adaptor also capable of interfacing said through-hole component to another position on said printed circuit board adapted to receive said surface mount component when said body member is oriented in a second position relative to said printed circuit board.

4. The electrical component adaptor of claim 3 wherein said adaptor in said first position is inverted relative to said adaptor in said second position.

5. The electrical component adaptor of claim 3 wherein said body member is formed of a nonconductive material.

6. The electrical component adaptor of claim 3 wherein said first region of said body member protrudes from the same so as to elevate said body member off of said printed circuit board when said adaptor is mounted on said board.

7. The electrical component adaptor of claim 3 wherein said conductive material is solder.

8. A method of interconnecting a through-hole component to a printed circuit board position designed for a surface mount component and for interconnecting a surface mount component to another printed circuit board position designed for a through-hole component, said method comprising the steps of
   mounting said through-hole component in a first adaptor,
   orienting said adaptor in a first position relative to said printed circuit board position,
   interconnecting said adaptor in said first position to said printed circuit board position,
   mounting said surface mount component in a second adaptor identical to said first adaptor,
   orienting said second adaptor in a second position relative to said another printed circuit board position, and
   interconnecting said adaptor in said second position to said another printed circuit board position.

* * * * *